US009984855B2

(12) United States Patent
Colvin et al.

(10) Patent No.: US 9,984,855 B2
(45) Date of Patent: May 29, 2018

(54) IMPLEMENTATION OF CO-GASES FOR GERMANIUM AND BORON ION IMPLANTS (75) Inventors: Neil K. Colvin, Merrimack, NH (US); Tseh-Jen Hsieh, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 621 days.

(21) Appl. No.: 12/948,309

(22) Filed: Nov. 17, 2010

(65) Prior Publication Data

US 2012/0119113 A1 May 17, 2012

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/006* (2013.01); *H01J 2237/022* (2013.01)

(58) Field of Classification Search
CPC .. H01J 37/3171; H01J 35/08; H01J 2237/006; H01J 2237/022
See application file for complete search history.

(56) References Cited

U.S. PATENT DOCUMENTS

| | | | | |
|---|---|---|---|---|
| 6,135,128 A * | 10/2000 | Graf et al. | | 134/1.1 |
| 6,215,245 B1 * | 4/2001 | Mori | | H01L 51/5231 313/503 |
| 7,301,160 B2 | 11/2007 | Banks | | |
| 7,446,326 B2 | 11/2008 | Chaney et al. | | |
| 7,511,287 B2 * | 3/2009 | Reece et al. | | 250/492.2 |
| 7,531,819 B2 | 5/2009 | DiVergilio et al. | | |
| 7,586,109 B2 * | 9/2009 | Perel | | H01J 37/08 250/423 R |
| 2002/0179854 A1 * | 12/2002 | Tsukihara | | G21K 1/08 250/492.2 |
| 2003/0234371 A1 * | 12/2003 | Ziegler | | C23C 14/0031 250/423 R |
| 2007/0075274 A1 * | 4/2007 | Reece | | H01J 37/3171 250/492.21 |
| 2009/0081874 A1 | 3/2009 | Cook et al. | | |
| 2010/0327159 A1 * | 12/2010 | Platow | | H01J 27/02 250/283 |
| 2011/0259366 A1 * | 10/2011 | Sweeney et al. | | 134/10 |
| 2013/0140473 A1 * | 6/2013 | Colvin et al. | | 250/492.3 |

OTHER PUBLICATIONS

Non-Final Office Action dated Oct. 15, 2013 for U.S. Appl. No. 12/948,369. 30 Pages.
Office Action dated May 5, 2014 U.S. Appl. No. 12/948,369.
Notice of Allowance dated Jun. 30, 2017 in connection with U.S. Appl. No. 12/948,309.

* cited by examiner

*Primary Examiner* — Eliza Osenbaugh-Stewart
(74) *Attorney, Agent, or Firm* — Eschweiler & Potashnik, LLC (57) ABSTRACT An ion implantation system for improving performance and extending lifetime of an ion source is disclosed. A fluorine-containing dopant gas source is introduced into the ion chamber along with one or more co-gases. The one or more co-gases can include hydrogen or krypton. The co-gases mitigate the effects caused by free fluorine ions in the ion source chamber which lead to ion source failure.

18 Claims, 8 Drawing Sheets

IMPLEMENTATION OF CO-GASES FOR GERMANIUM AND BORON ION IMPLANTS

FIELD OF INVENTION

The present invention relates generally to semiconductor device fabrication and ion implantation, and more particularly to a method of improving performance and extending the lifetime of an ion source in an ion implanter.

BACKGROUND OF THE INVENTION

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

Figure 1:
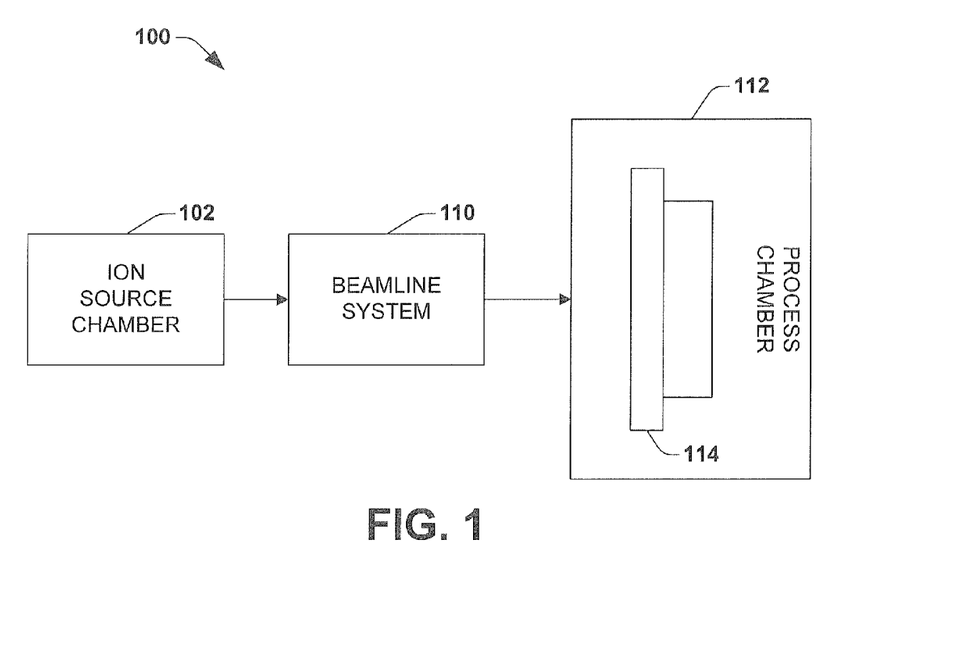
FIG. 1 is an ion implantation system suitable for implementing one or more aspects of the invention in block diagram form.

Referring to FIG. 1 ion implanters or ion implantation systems typically include three sections or subsystems: (i) an ion source chamber 102 containing an ion source for outputting an ion beam, (ii) a beamline assembly 110 including a mass analysis magnet for mass resolving the ion beam, and (iii) a process chamber 112 which contains a target location that receives the ion beam from the beam line assembly, such as a semiconductor wafer 114 or other substrate to be implanted by the ion beam. The continuing trend toward smaller semiconductor devices requires a beamline construction which serves to deliver high beam currents at low energies. The high beam current provides the necessary dosage levels, while the low energy permits shallow implants. Source/drain junctions in semiconductor devices, for example, require such a high current, low energy application.

Ion sources in ion implanters typically generate an ion beam by ionizing within the source chamber 102 a source gas, a component of which is a desired dopant element, and extracting the ionized source gas in the form of an ion beam. The ion source may take the form of an inductively heated cathode (IHC), typically utilized in high current ion implantation equipment.

Examples of desired dopant elements of which the source gas is comprised include boron (B), germanium (Ge), phosphorus (P), or silicon (Si). The source gas may be, for example, a fluorine-containing gas, such as boron trifluoride ($BF_3$), germanium tetrafluoride ($GeF_4$), phosphorous trifluoride ($PF_3$), or silicon tetrafluoride ($SiF_4$), amongst others.

When the ion source is operated with a molecular source gas, species in addition to the desired species for implantation are often produced, resulting in ion source failure due to the accumulation or corrosive properties of these species generated during disassociation/ionization of the source gases. Some of these species may have very low vapor pressures, and as a result condense on the interior surfaces of the source. These solid deposits may interfere with ion source operation over time, for example by changing the electrical characteristics of the walls or partially blocking the ion source electrode aperture, thereby reducing the available ion current.

The decreased lifetime of ion sources used in germanium and boron ion implantation can be ascribed to the generation of free fluorine radicals during dissociation of germanium tetrafluoride ($GeF_4$) and boron trifluoride ($BF_3$) source gas. These fluorine radicals react with the refractory metals, such as tungsten and molybdenum, commonly used to construct the ion source chambers in order to provide structural integrity at elevated operating temperatures of 700° C. or more. The tungsten hexafluoride ($WF_6$) or molybdenum fluoride ($MoF_6$) molecules decompose on hot surfaces and condense at the cathode surface in what is known as the halogen cycle. The $WF_6$ and $MoF_6$ molecules generate six additional free fluorine radicals each, thereby accelerating $WF_6$ and $MoF_6$ formation. These molecules do not decompose spontaneously on chamber surfaces without the presence of a reducer to strip the fluorine atoms. The tungsten and molybdenum molecules accumulate on cathode surfaces, increasing cathode size and resulting in the degradation of electron emissions from the surface of the cathode.

Additionally, excess free fluorine radicals in the ion source chamber 102 can result in etching of the chamber housing material and internal components. Fragile columnar structures build up and break off, causing discharges by either bridging the cathode or repeller to ground or being ejected into the extraction/extraction suppression high voltage field causing a discharge This material can then be transported down the beamline to the wafer. It has been shown that material or debris that is generated inside the ion source chamber may be extracted and transported to the substrate. These particulates have a direct effect on semiconductor device yield.

One method of removing these deposits is the time consuming process of removing the ion source from the system and physically cleaning the source or running a species of gas to sputter clean the arc chamber at some predetermined interval. This process is not highly effective, and in either case tool productivity is severely impacted. Another method is to clean the source in situ by flowing a highly reactive gas through the source, where the gas species is chosen such that the flourine gas radicals are captured, and pumped away before they can attack the internal and external ion source components.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the invention facilitate ion implantation processes by providing a method for improving performance of an ion source in an ion implanter in which at least one co-gas is introduced into an ion source chamber together with a fluorine-containing dopant source gas, the co-gas reacting with dissociated and ionized fluorine constituents of the source gas to reduce damage to the ion source chamber and increase ion source lifetime. Associated apparatus and an ion implantation system for carrying out the method are disclosed herein.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The invention will now be described with reference to the attached drawings, wherein like reference numerals are used to refer to like elements throughout. It will be appreciated by those skilled in the art that the invention is not limited to the exemplary implementations and aspects illustrated and described hereinafter.

Referring initially to FIG. 2, an ion implantation system 200 suitable for implementing one or more aspects of the invention is depicted in block diagram form.

Figure 2A:
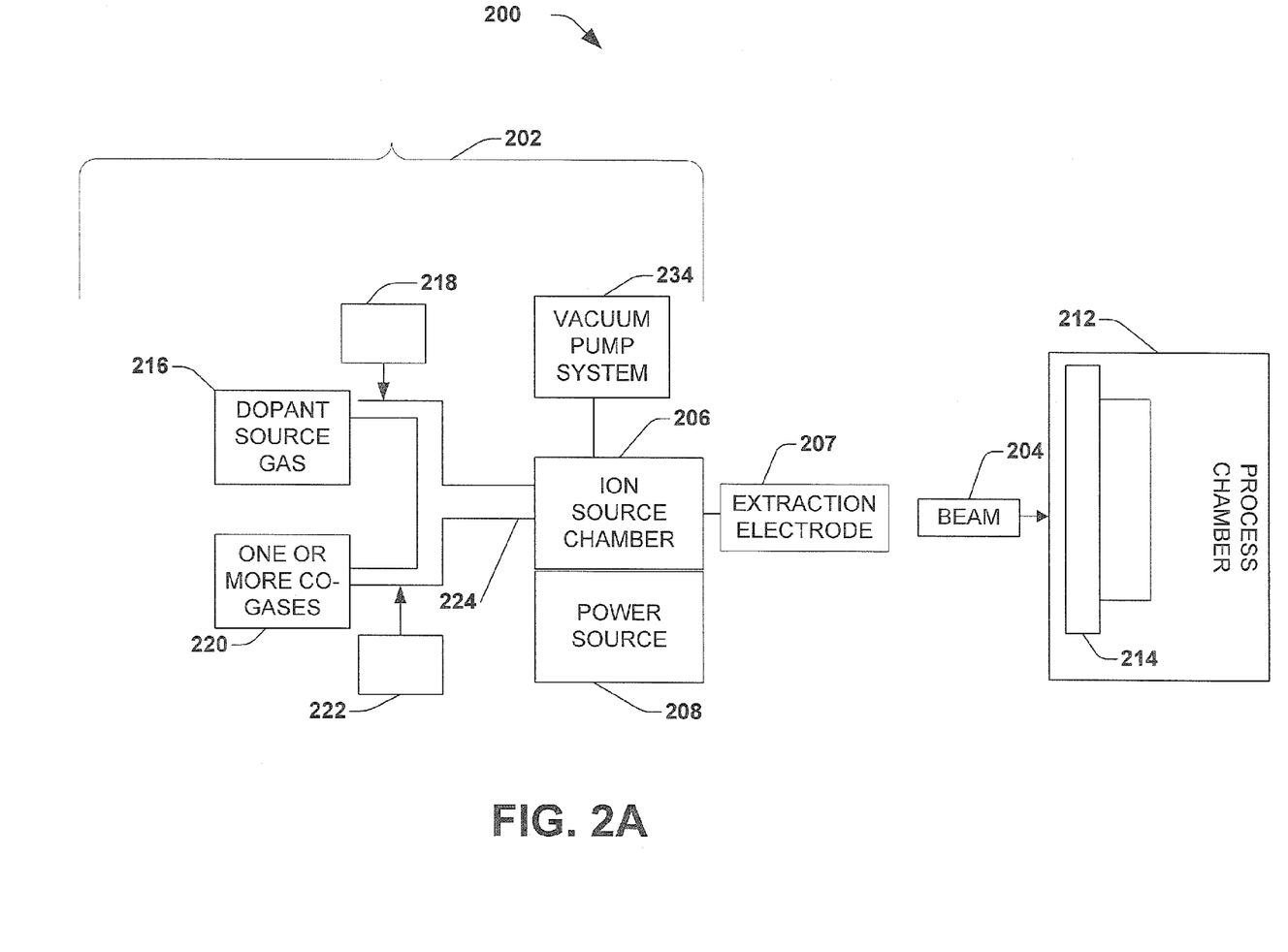
FIG. 2A is an ion implantation system illustrating one embodiment of an ion source assembly in accordance with an aspect of the invention.

The system 200 includes an ion source assembly 202 for producing an ion beam 204 along a beam path. The ion source assembly 202 includes, for example, a plasma source 206 with an associated power source 208. The plasma source 206 may, for example, comprise a relatively long plasma confinement chamber from which an ion beam is extracted and accelerated.

A supply of a fluorine-containing dopant gas source 216 is coupled to the ion source chamber 206 via an inlet 224. Dopant gas controller 218 operatively controls the flow and rate of dopant gas source 216 to the ion source chamber 206. A supply of at least one co-gas 220 is coupled to ion source chamber 206 via inlet 224. Co-gas controller 222 operatively controls the flow and rate of co-gas to be supplied to ion source chamber 206.

The fluorine-containing dopant gas may comprise one or more of boron trifluoride ($BF_3$), germanium tetrafluoride ($GeF_4$), phosphorous trifluoride ($PF_3$), or silicon tetrafluoride ($SiF_4$). The at least one co-gas may comprise one or more of hydrogen ($H_2$) or krypton (Kr).

During operation of the ion source chamber 206, the fluorine-containing dopant gas source 216 and at least one co-gas 220 are introduced into the ion source chamber through inlet 224. The fluorine-containing dopant gas source 216 is dissociated and/or ionized to form a plasma of charged particles containing dopant ions and fluoride ions. Free fluoride ions react with hydrogen co-gas 220 to form hydrogen fluoride molecules which are removed from the chamber 206 by escaping from the arc slit and or gaps between the ion source chamber body and its components. A portion of the molecules which are positively charged are extracted by an extraction electrode 207 and transported to the AMU beam guide 211). In both cases it is pumped by the vacuum pump system 234.

Figure 2B:
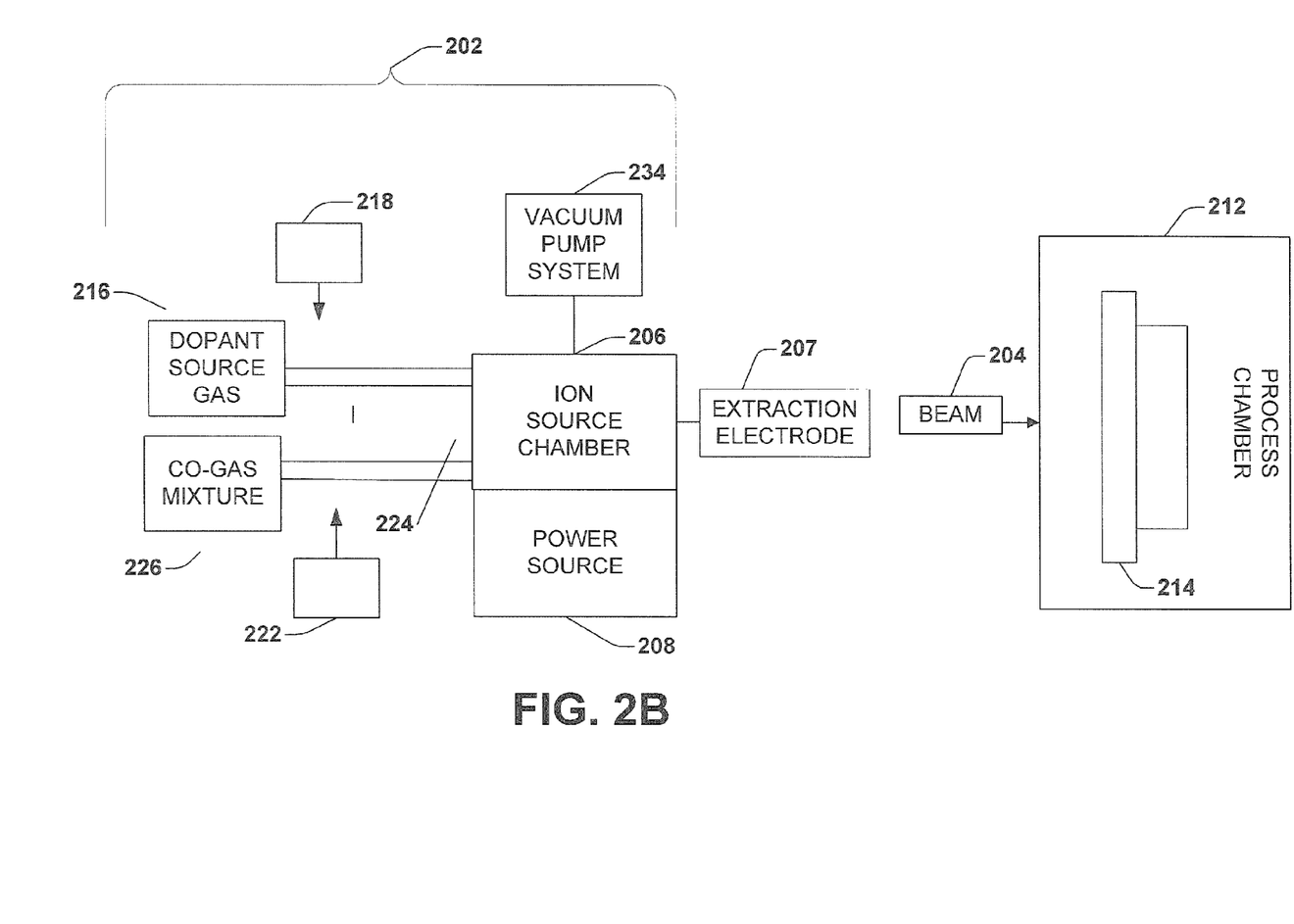
FIG. 2B is an ion implantation system illustrating an alternative embodiment of an ion source assembly in accordance with an aspect of the invention.
Figure 2C:
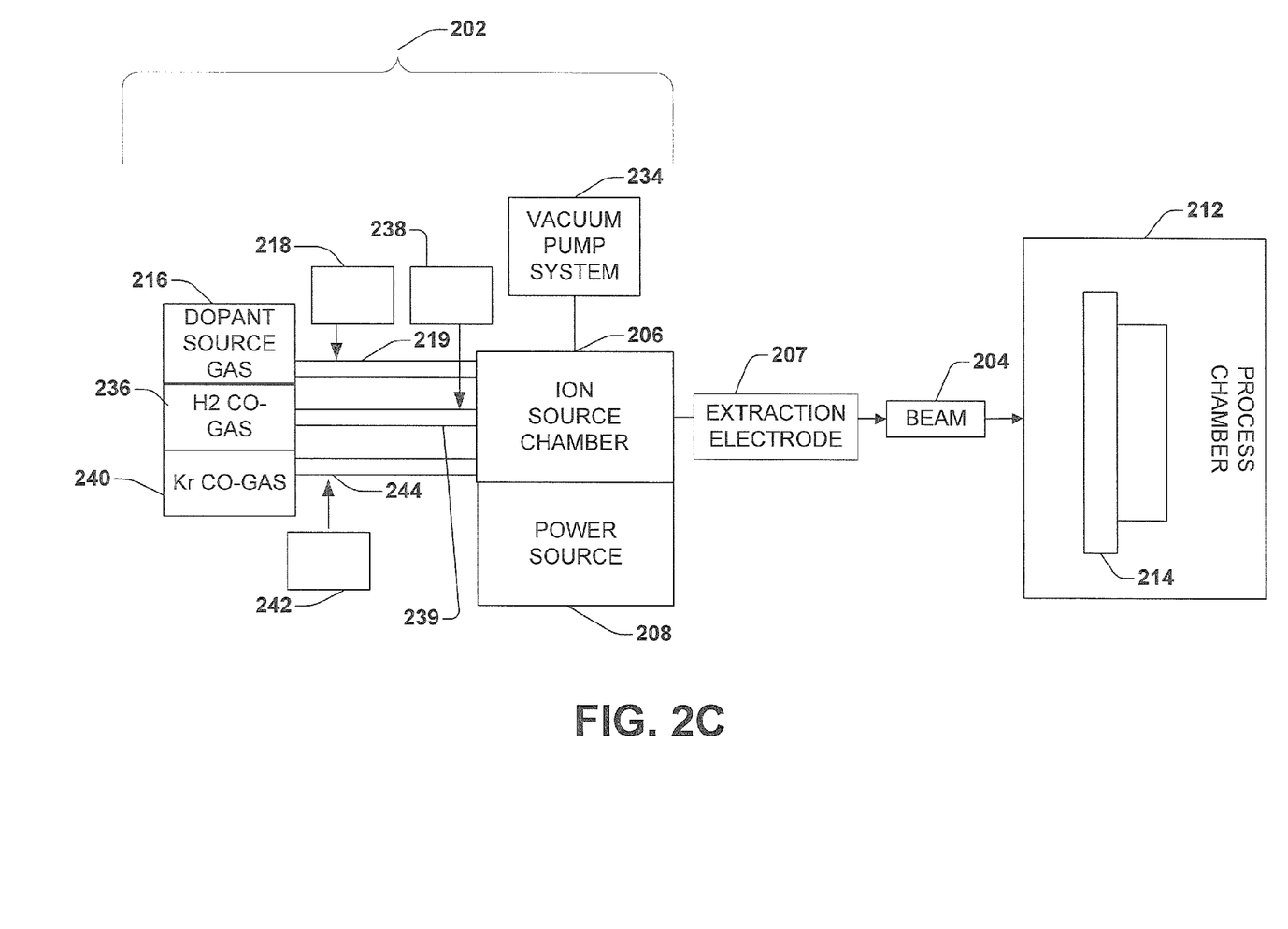
FIG. 2C is an ion implantation system illustrating a further embodiment of an ion source assembly in accordance with an aspect of the invention.
Figure 2D:
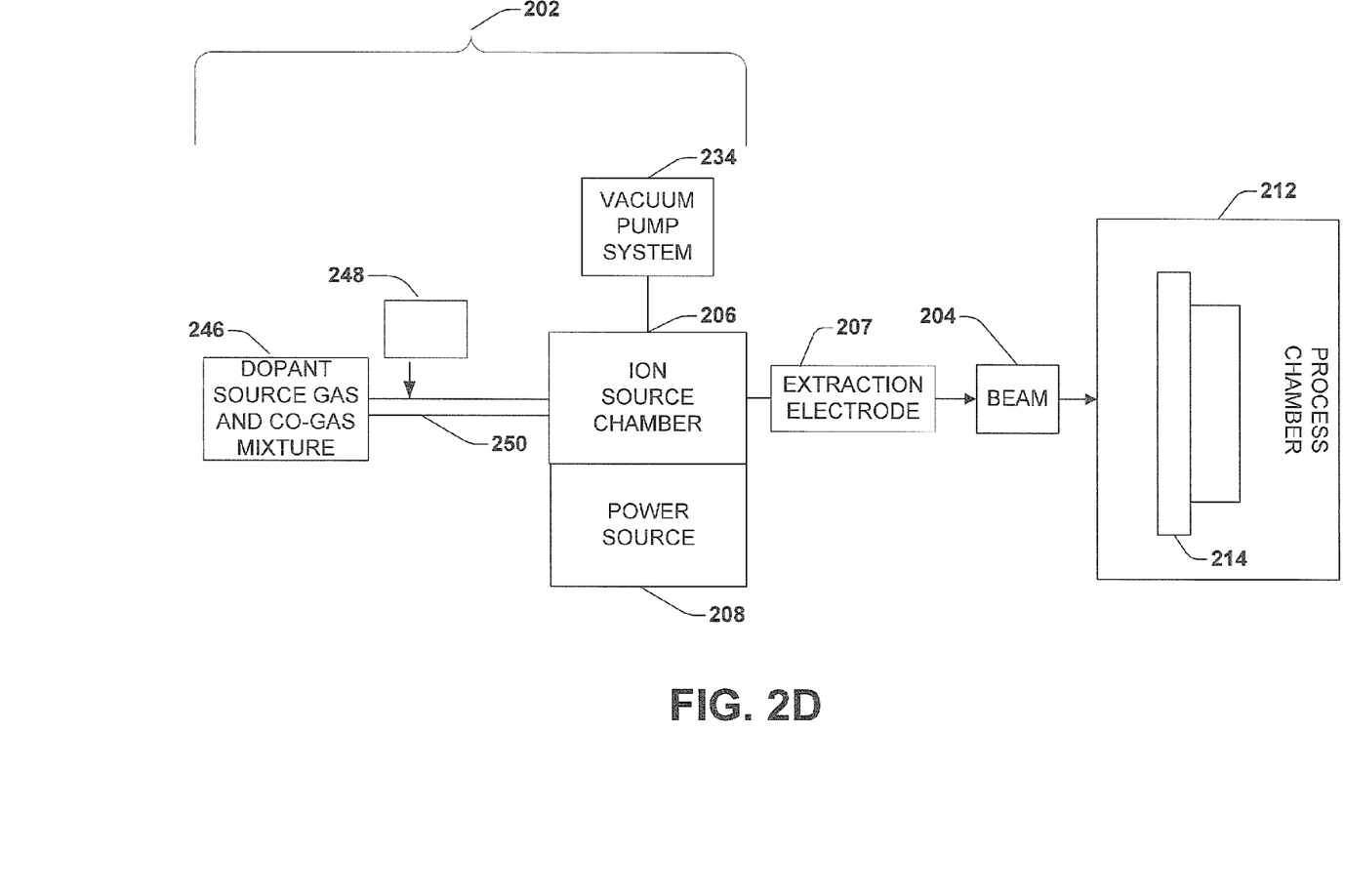
FIG. 2D is an ion implantation system illustrating yet a further embodiment of an ion source assembly in accordance with an aspect of the invention.

FIGS. 2B-2D illustrate alternative embodiments of the invention. Where the fluorine-containing dopant gas source and at least one co-gas were obtained from separate supplies and mixed in inlet 224 prior to entry into the ion source chamber 206 in the previous embodiment, it is also contemplated that where the co-gas includes more than one co-gas, e.g., hydrogen and krypton, the co-gas source may be obtained as a pre-mixed product and supplied to the ion source chamber as a single product, as illustrated in FIG. 2B. In FIG. 2B, the ion implantation system 200 includes an ion source assembly 202 comprising a fluorine-containing dopant source gas 216 and a mixture of co-gases supplied in a single source 226. The fluorine-containing dopant source gas 216 is supplied to ion source chamber 206 through inlet 224, with dopant gas controller 218 controlling the flow and rate of dopant gas source 216 into the ion source chamber 206. Single source mixture of co-gases 226 enters ion source chamber 206 through inlet 224, with co-gas controller 222 controlling the flow and rate of mixture 226 into the ion source chamber 206. While the embodiment of FIG. 2B illustrates a single inlet 224 by which both the fluorine-containing dopant gas source 216 and the co-gas mixture 226 enter the ion source chamber 206, it is also contemplated that gas source 216 and co-gas mixture 226 may enter the ion source chamber via a separate inlet, e.g., an inlet for gas source 216 and a separate inlet for co-gas mixture 226.

During operation of the ion source chamber 206, the fluorine-containing dopant gas source 216 and co-gas mixture 226 are released into the ion source chamber 206 through inlet 224. The fluorine-containing dopant gas source is dissociated and/or ionized to form a plasma of charged particles containing dopant ions and fluoride ions. Free fluoride ions react with hydrogen ions from co-gas mixture 226 to form hydrogen fluoride molecules which are removed from the chamber 206 by a vacuum pump system 234. Krypton gas of co-gas mixture 226 is ionized and accelerates to the negatively charged cathode and repeller. This collision results in cathode and repeller atoms being sputtered from those critical surfaces and redeposited onto other less critical surfaces within the ion source chamber 206. The ionized krypton is extracted from the arc chamber via the extraction electrode 207. Neutrally charged krypton ions leak out the arc slit and other gaps between arc chamber components and are pumped by the vacuum pump system 234.

FIG. 2C illustrates a further embodiment in which separate inlets 219, 239, 244 are provided, inlet 219 for source gas 216, inlet 239 for hydrogen co-gas and inlet 244 for krypton co-gas 240. The gases 216, 236, 240 are then mixed in the ion source chamber 206. The rate and flow of fluorine-containing dopant gas source 216 into the ion source chamber 206 is controlled by dopant gas controller 218. Hydrogen co-gas 236 enters ion source chamber 206 through inlet 239, the rate and flow of which is controlled by co-gas controller 238. Krypton co-gas 240 enters ion source chamber 206 through inlet 244, the rate and flow of which is controlled by co-gas controller 242.

A still further embodiment of ion source system 200 is illustrated inf FIG. 2D in which dopant gas source and a compatible co-gas mixture are provided as a single source 246. Single source mixture 246 of fluorine-containing dopant gas and co-gases enters ion source chamber 206 through inlet 250, with controller 248 controlling the flow and rate of mixture 246 into the ion source chamber 206.

Figure 3:
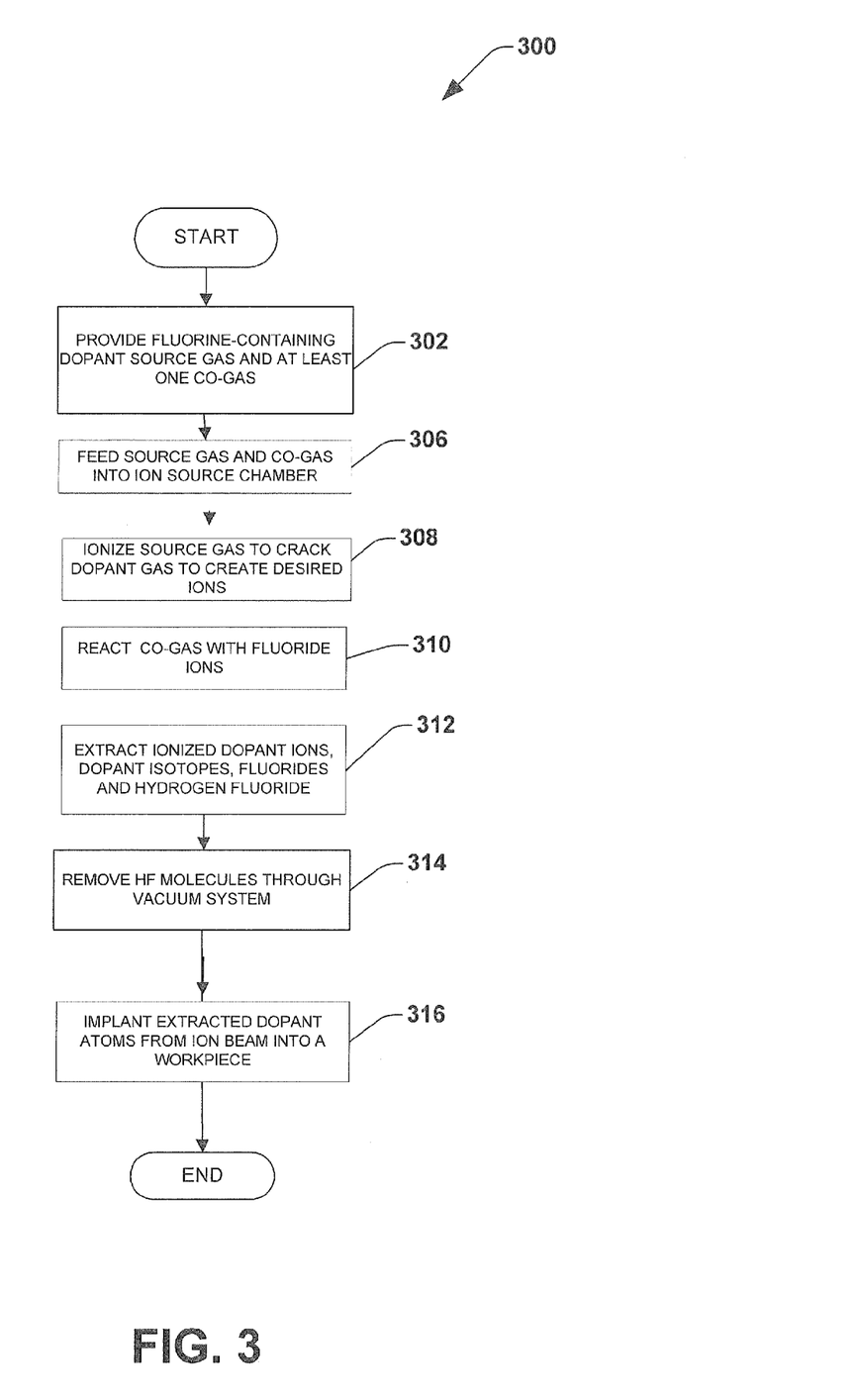
FIG. 3 is a flow diagram illustrating a method of in accordance with an aspect of the invention.

FIG. 3 is a flow diagram illustrating a method 300 for improving performance and extending lifetime of an ion source in an ion implanter in accordance with an aspect of the invention. The method 300 employs at least on co-gas during operation of the ion implantation system in order to facilitate removal of free fluoride ions generated when a fluorine-containing dopant source gas is utilized. The above figures and description can also be referenced with this method 300 for further description.

The method 300 begins at block 302 wherein a fluorine-containing dopant source gas and at least one co-gas are supplied. The method continues at 306 where the fluorine-containing source gas and at least one co-gas are introduced into an ion source chamber. Electrons emitted by a cathode are accelerated and ionize the gas molecules of the fluorine-containing dopant source gas at 308 within the ion source chamber to crack the fluorine-containing dopant gas and create the desired ions. At 310, the co-gas is reacted with fluoride ions. Ionized dopant ions, dopant isotopes fluorides and hydrogen fluoride are extracted at 312. The dissociated and ionized fluorine ion constituents are reacted with the at least one co-gas. Where the co-gas comprises hydrogen, hydrogen fluoride molecules will be formed and removed from the ion source chamber at 314. What gas is not at a positive charge will leak out of the arc chamber and then be pumped by the vacuum pump system. At 316, the extracted dopant ions are implanted from an ion beam into a workpiece, such as a silicon wafer.

While, for purposes of simplicity of explanation, the method 300 is depicted and described as executing serially, it is to be understood and appreciated that the invention is not limited by the illustrated order, as some aspects could, in accordance with the present, occur in different orders and/or concurrently with other aspects from that depicted and described herein. For instance, it is contemplated that the flow of fluorine-containing dopant gas and at least one co-gas into the ion source chamber may occur simultaneously. In another embodiment, it is contemplated that flow of these gases may occur sequentially such that a fluorine-containing dopant gas is introduced into the ion source chamber, followed by a flow of at least one co-gas into the ion source chamber. Moreover, not all illustrated features or blocks may be required to implement a methodology in accordance with an aspect the invention.

The selected flow rates of the at least one co-gas required to achieve maximum beam current and best productivity can be established empirically. A flow of co-gas which is too low in proportion to the fluorine-containing dopant source gas will not effectively remove free fluorine ions to the benefit of improving performance and extending lifetime of an ion source in an ion implanter A flow of co-gas which is too high may result in a reduced yield of dopant ions in the plasma and reduction in available dopant ion current. Additionally, a flow rate of combined gases which is too high will increase source pressure, with increased risk of arcing to the extraction electrodes. Thus, it is desired that the maximum amount of fluoride radicals be removed without deleteriously affecting the beam current. The flow rate of the at least one co-gas can be predetermined by defining a recipe which delivers the required beam currents without the use of co-gas, and then introducing a co-gas flow incrementally until the beam current begins to drop off. To ensure stable beam current performance through the life of the source the flow can be set to some percent below that threshold. Additionally, the recipe can be further validated by performing an AMU beam spectrum and comparing the reduction in the undesired gas versus the increased resulting gas formed after the reaction with the co-gas. In this manner, the rate and flow of co-gas into the ion source chamber can be adjusted during operation of the ion implantation system.

Figure 4:
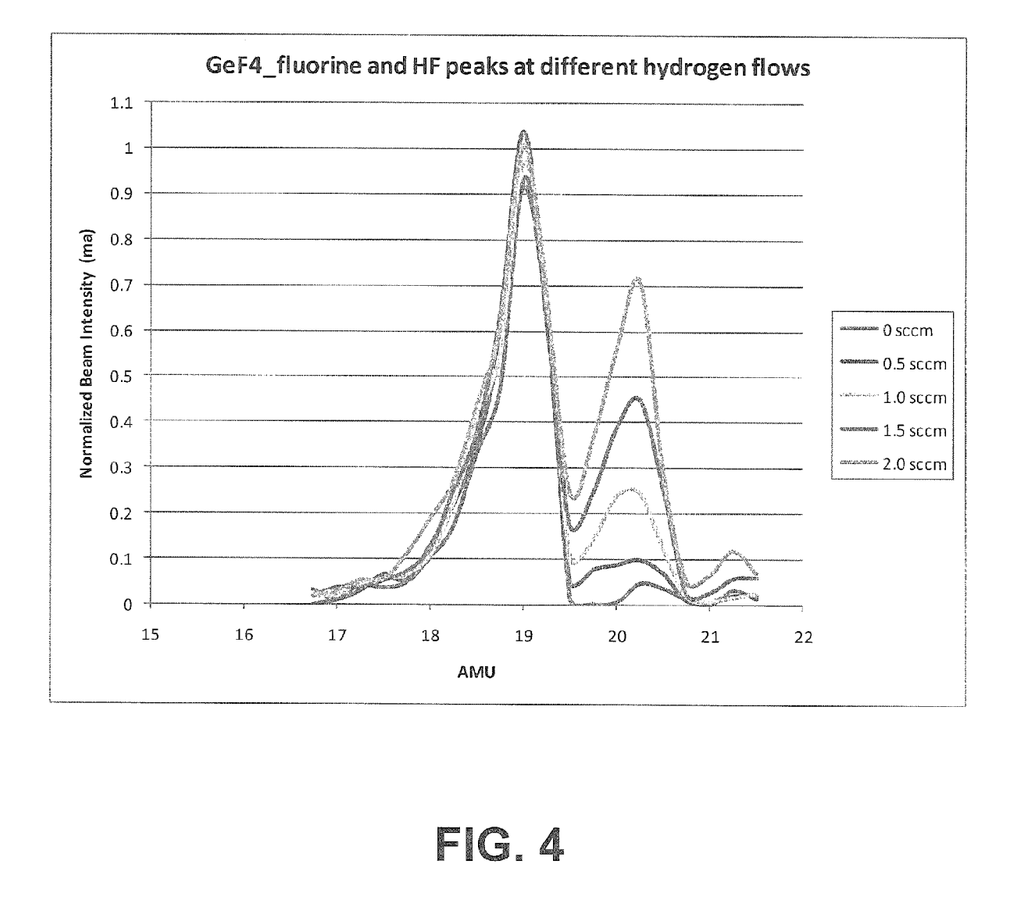
FIG. 4 is a graphical representation illustrating the fluorine peak at amu-19 and HF peak at amu-20 where F amplitude (ion current) reduced and HF increased as the flow rate of the co-gas increases.
Figure 5:
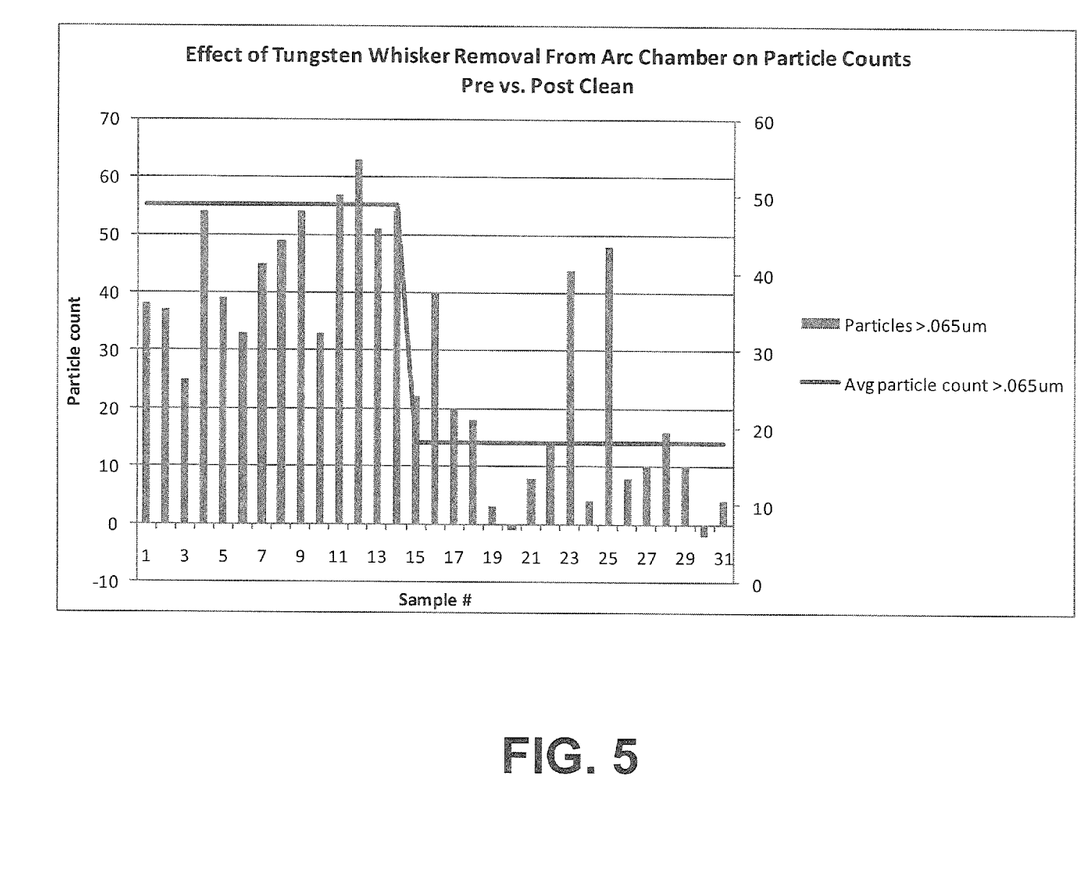
FIG. 5 is a graphical representation illustrating the reduction in particles due to removing the columnar formations of W from the arc slit and arc chamber liners due to etching of grain boundaries by fluorine.

In FIG. 4 there is illustrated graphical representation illustrating the fluorine peak at amu-19 and HF peak at amu-20 where F amplitude (ion current) reduced and HF increased as the flow rate of the co-gas increases. A mass spectrum analysis was run for each level of co-gas flow. The recipe is first optimized without the use of cogas (as depicted by 0 sccm of gas flow). Referring to FIG. 4, the highest peak of flourine (amu 19) was obtained at amu 19 and the smallest HF peak at amu 20. As the flow of co-gas was increased the F peak decreased and the HF peak increased. Thus it was determined that at 2.5 sccm of co-gas the beam current began to drop and a determination was made to run at 2 sccm to ensure stable beam currents throughout the life of the ion source chamber. FIG. 5 is a graphical representation illustrating the reduction in particles due to removing the columnar formations of W from the arc slit and arc chamber liners due to etching of grain boundaries by fluorine. The quantity of particles measuring greater than 0.065 um on the wafer after each implant was measured, as well as the reduction (mean value) of particles after the removal of columnar formations according to the method of the invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

What is claimed is:

1. An ion implantation system for improving performance and extending lifetime of an ion source in an ion implanter comprising:

an ion source assembly comprising a dopant gas controller, a co-gas controller, and an ion source chamber, the dopant gas controller operatively controlling the rate and flow of a fluorine-containing dopant gas source into the ion source chamber, and the co-gas controller operatively controlling the rate and flow of a co-gas into the ion source chamber, wherein the dopant gas controller and the co-gas controller are configured to operatively control a combined rate and flow of the fluorine-containing dopant gas and the co-gas to limit a pressure within the ion source chamber, and wherein the co-gas controller is further configured to adjust the rate and flow of the co-gas into the ion source chamber during operation of the ion implantation system to achieve a maximum beam current of an ion beam formed therein, wherein the co-gas controller is configured to incrementally increase the flow of the co-gas into the ion source chamber until the beam current begins to decrease, thereby establishing a threshold co-gas flow, and to further validate the beam current based on a mass spectral analysis performed on the ion beam and a comparison of a measured reduction in an undesired gas associated with the fluorine-containing dopant gas and a measured increase in a resultant gas formed after a reaction of the fluorine-containing dopant gas with the co-gas;

a beam line assembly that receives the ion beam from the ion source and processes the ion beam; and a target location that receives the ion beam from the beam line assembly.

2. The system of claim 1, wherein the co-gas controller releases the co-gas from one or more co-gas sources into the ion source chamber.

3. The system of claim 2, wherein the co-gas and the dopant gas are released into the ion source chamber simultaneously.

4. The system of claim 2, wherein the co-gas and the dopant gas are released into the ion source chamber sequentially.

5. The system of claim 1, wherein the fluorine-containing dopant gas source comprises one or more of boron trifluoride, germanium tetrafluoride, phosphorous trifluoride, or silicon tetrafluoride.

6. The system of claim 1, wherein the co-gas comprises hydrogen.

7. The system of claim 6, wherein the co-gas reacts with the fluorine-containing dopant gas to form hydrogen fluoride.

8. The system of claim 7, wherein the co-gas further comprises krypton.

9. An apparatus for improving performance of an ion source in an ion implanter comprising:

a dopant gas controller for introducing a dopant gas into the ion source chamber, the dopant gas comprising a fluorine-containing gas; and a co-gas controller for introducing at least one co-gas into the ion source chamber, the co-gas reacting with the fluorine in the dopant gas to improve the performance of the ion source, wherein the dopant gas controller and the co-gas controller are configured to operatively control a combined rate and flow of the dopant gas and the co-gas to limit a pressure within the ion source chamber, and wherein the co-gas controller is further configured to adjust the rate and flow of the co-gas into the ion source chamber during operation of the ion source chamber to achieve a maximum beam current of an ion beam formed therein, wherein the co-gas controller is configured to incrementally increase the flow of the co-gas into the ion source chamber until the beam current begins to decrease, thereby establishing a threshold co-gas flow, and to further validate the beam current based on a mass spectral analysis performed on the ion beam and a comparison of a measured reduction in an undesired gas associated with the fluorine-containing gas and a measured increase in a resultant gas formed after a reaction of the fluorine-containing gas with the co-gas.

10. The apparatus of claim 9, wherein the at least one co-gas reacts with the fluorine-containing dopant gas to produce hydrogen fluoride.

11. The apparatus of claim 9, wherein the co-gas comprises hydrogen.

12. The apparatus of claim 11, wherein the co-gas further comprises krypton.

13. A method for improving productivity of an ion source including an ion source chamber, the method comprising:

introducing a fluorine-containing dopant gas to the ion source chamber for generating a plasma therein;

introducing at least one co-gas to the ion source chamber, the co-gas being operative to react with fluorine ions in the plasma to reduce formation of contaminants in the ion source chamber, wherein introducing the fluorine-containing dopant gas and the at least one co-gas to the ion source chamber limits a pressure within the ion source chamber by controlling a combined rate and flow of the fluorine-containing dopant gas and the co-gas, and wherein the rate and flow of the co-gas into the ion source chamber is adjusted during operation of the ion source chamber, wherein the flow of the co-gas into the ion source chamber is incrementally increased until a beam current of an ion beam formed therein begins to decrease, thereby defining a maximum beam current of the ion beam and establishing a threshold co-gas flow, and wherein the beam current is further validated based on a mass spectral analysis performed on the ion beam and a comparison of a measured reduction in an undesired gas associated with the fluorine-containing dopant gas and a measured increase in a resultant gas formed after a reaction of the fluorine-containing dopant gas with the co-gas;

exciting the fluorine-containing dopant gas within the chamber to create a plasma of dissociated and ionized dopant and fluorine constituents; and reacting the dissociated and ionized fluorine constituents with the at least one co-gas to reduce poisoning of the ion source chamber and increase ion source lifetime.

14. The method of claim 13, the gas source comprising one or more of boron trifluoride, germanium tetrafluoride, phosphorous trifluoride, or silicon tetrafluoride.

15. The method of claim 14, wherein the co-gas comprises hydrogen.

16. The method of claim 15, wherein the co-gas further comprises krypton.

17. The method of claim 15, wherein the reacting of the dissociated and ionized fluorine constituents with the at least one co-gas comprises forming hydrogen fluoride.

18. The method of claim 13, further comprising releasing a predetermined amount of co-gas into the ion source chamber.

* * * * *